United States Patent [19]
Rauvola

[11] Patent Number: 5,576,666
[45] Date of Patent: Nov. 19, 1996

[54] FRACTIONAL-N FREQUENCY SYNTHESIZER WITH TEMPERATURE COMPENSATION

[75] Inventor: Roger Rauvola, Carlsbad, Calif.

[73] Assignee: Nippondenso Technical Center USA, Inc., Carlstad, Calif.

[21] Appl. No.: 150,881

[22] Filed: Nov. 12, 1993

[51] Int. Cl.⁶ .................................. H03L 7/18; H03L 7/08
[52] U.S. Cl. ................ 331/25; 331/176; 331/16; 331/66; 327/105; 327/106
[58] Field of Search ....................... 331/1 R, 1 A, 331/66, 16, 176, 25, 27; 327/105, 107, 106; 332/123, 124, 128

[56] References Cited

U.S. PATENT DOCUMENTS

| | | | |
|---|---|---|---|
| 4,179,670 | 12/1979 | Kingsbury | 331/10 |
| 4,297,657 | 10/1981 | Frerking | 331/176 |
| 4,380,743 | 4/1983 | Underhill et al. | 331/1 A |
| 4,484,355 | 11/1984 | Henke et al. | 455/76 |
| 4,513,259 | 4/1985 | Frerking | 331/176 |
| 4,519,086 | 5/1985 | Hull et al. | 375/120 |
| 4,611,181 | 9/1986 | Fukumura et al. | 331/66 |
| 4,712,078 | 12/1987 | Slobodnik, Jr. et al. | 331/99 |
| 4,746,879 | 5/1988 | Ma et al. | 331/44 |
| 4,893,097 | 1/1990 | Zwack | 331/176 |
| 4,929,918 | 5/1990 | Chung et al. | 331/10 |
| 4,937,537 | 6/1990 | Nyqvist | 331/17 |
| 5,038,120 | 8/1991 | Wheatley et al. | 331/16 X |
| 5,061,907 | 10/1991 | Rasmussen | 331/57 |
| 5,079,521 | 1/1992 | Gaskell et al. | 331/1 A |
| 5,126,699 | 6/1992 | Kabler | 332/124 |
| 5,136,260 | 8/1992 | Yousefi-Elezei | 331/17 |
| 5,204,975 | 4/1993 | Shigemori | 455/231 |
| 5,216,389 | 6/1993 | Carralero et al. | 331/18 |
| 5,317,285 | 5/1994 | Chan | 331/16 |

FOREIGN PATENT DOCUMENTS 0222519  9/1989  Japan ................... 331/1 R

OTHER PUBLICATIONS

Mason, K., IC s for Communication "Designer Guide to Frequency Synthesis using the UMA1000", Report No.: SCO/AN92002, Product Concept & Application Laboratory Southampton, England, Philips Semiconductors Application Note, pp. 1–59.

Primary Examiner—Robert Pascal
Assistant Examiner—Arnold Kinkead
Attorney, Agent, or Firm—Cushman, Darby & Cushman

[57] ABSTRACT

A fractional-N frequency synthesizer which incorporates division by a fractional value. Division is by a first value during first cycles and by a second value during second cycles. During the first cycles, an error in value accumulates, and when it reaches a certain value, causes a change in the dividing ratio to reduce the error value. The increase and decrease in error causes spurs in the output frequency spectrum. These spurs are cancelled using a cancellation network. The gain of the phase detector is temperature-compensated and the gain of the spur cancellation network is not, but the temperature compensation of the phase detector gain causes compensation of both values.

12 Claims, 9 Drawing Sheets

$R1 = 6.19 \cdot 10^3$    $R2 = 6.19 \cdot 10^3$ $TRo = 1 \cdot 10^4$

FRACTIONAL-N FREQUENCY SYNTHESIZER WITH TEMPERATURE COMPENSATION

FIELD OF THE INVENTION

The present invention defines an improvement in a fractional-N synthesizer phase locked loop system. More specifically, the present invention describes a circuit with a fractional-N phase locked loop and a temperature compensating network therefor.

BACKGROUND OF THE INVENTION

The present invention describes an improvement in a frequency synthesizer specifically intended for use in a telecommunications application. Such frequency synthesizers must exhibit, among other things, low spurious spectral content, fast settling time of frequency or phase, and low sideband phase noise.

Many synthesizers are comprised of phase locked loops that use integer division methods to produce the desired ouput frequency. These phase-locked loops exhibit high division ratios, which causes difficulty in optimizing many of the above performance parameters.

A fractional-N type phase locked loop ("PLL") divides by a fractional value in order to lower the division ratio while maintaining the same frequency step size.

Briefly, this is accomplished as follows. A fractional counting scheme uses at least two different division ratios, that are dynamically switched with each reference cycle. For example, to divide by 133.125, division by 133 is controlled during seven cycles, and division by 134 during an eighth cycle. Hence, the average division ratio over eight reference cycles is 133.125. During the time that the system is dividing by 133, however, the instantaneous phase error seen by the phase detector accumulates with each reference cycle. Then, at the end of the eighth cycle, during which the system divides by 134, the error rapidly decreases to zero, only to begin accumulating again with the repeated process. The resultant sawtooth waveform modulates the synthesizer's output frequency in an FM fashion, causing an undesired spur in the output spectrum. Hence, this fractional counting scheme reduces the loop division ratio, but does so only at the expense of added spurs which are generated by the fractional counting scheme.

The fractional spur can be compensated by adding an equal amount of energy per compare cycle, opposite in phase to the sawtooth output of the phase detector. This removes the AC component, which cancels the effect of the fractional modulation producing the undesired spurs. However, the inventor of the present invention found that this cancellation is extremely temperature dependent. Even over a moderate temperature range, the amount of cancellation may vary significantly. The subject of this invention is an improved way to compensate this temperature-based variation.

Temperature compensation of phase locked loops and other frequency division structures is known, in general, in the art.

U.S. Pat. No. 4,397,537, for example, shows that a phase detector with differential outputs can be temperature compensated against common mode fluctuations via the common mode rejection ratio of an OP-Amp. It also teaches temperature-compensating the voltage controlled oscillator ("VCO") of the loop.

U.S. Pat. No. 4,929,918 shows a frequency locked loop ("FLL") can be used in conjunction with a PLL to dynamically compensate the VCO against component tolerance variations as well as temperature fluctuations.

U.S. Pat. Nos. 4,484,355; 5,126,699; 5,204,975; and 5,216,389 teach temperature compensation of crystal reference oscillators used as inputs to a PLL. U.S. Pat. Nos. 5,136,260; 5,061,907; and 4,519,086 teach temperature compensation of VCO's used in PLL's.

None of the these patents, however, teach or suggest a way in which temperature compensation could be extended to the spur cancellation of a fractional-N counting type phase locked loop.

More generally, all of these prior art documents teach that each element of a phase locked loop is separately compensated, using independent compensation network, respectively. The present invention, for the first time, teaches a way in which a single temperature compensation in one part of a loop can be used to temperature compensate a process in a different part of the loop.

SUMMARY OF THE INVENTION

The inventor of the present invention noticed the above, and found that by appropriate temperature compensation of the gain of the phase detector of a phase locked loop, the spur cancellation could also be temperature-compensated. This is made possible for those PLL IC's whose phase detector gain controlled by a phase detector gain adjustment network has a much higher temperature dependence than an uncompensated spur cancellation gain controlled by a spur cancellation gain network. Hence, the present invention defines a system in which temperature compensation of one part of a phase locked-loop is used to temperature compensate some other part of the phase locked loop. The prior art teaching requires separate temperature-compensation of each part of a phase locked loop.

In its more specific teaching, the present invention explains a temperature compensation network for a fractional-N counting phase locked loop which has an external phase detector gain setting network and an external spur cancellation gain setting network. The preferred mode of the present invention adds temperature compensation only to the phase detector gain network, and by so doing also temperature compensates the spur cancellation. This is made possible for those designs where the temperature drift of the phase detector gain has a significantly greater effect on spur levels than that of the spur cancellation gain. It is therefore an object of the present invention to use the phase detector gain temperature compensation to compensate the spur cancellation.

Another aspect of the present invention defines a phase locked loop circuit which has two connections for external networks which set parameters of the loop. One network determines at least partly the phase detector gain and another network determines an amount of fractional spur cancellation. Specifically, the present invention defines adding temperature compensation to the network used for determining the phase detector gain using a temperature compensation circuit that compensates both phase detector gain and spur cancellation.

BRIEF DESCRIPTION OF THE DRAWINGS

These and other aspects of the invention will now be described in detail with reference to the accompanying drawings, wherein.

DESCRIPTION OF THE PREFERRED EMBODIMENT

The best mode and presently preferred embodiment of the present invention is described herein with reference to the accompanying drawings.

Figure 1:
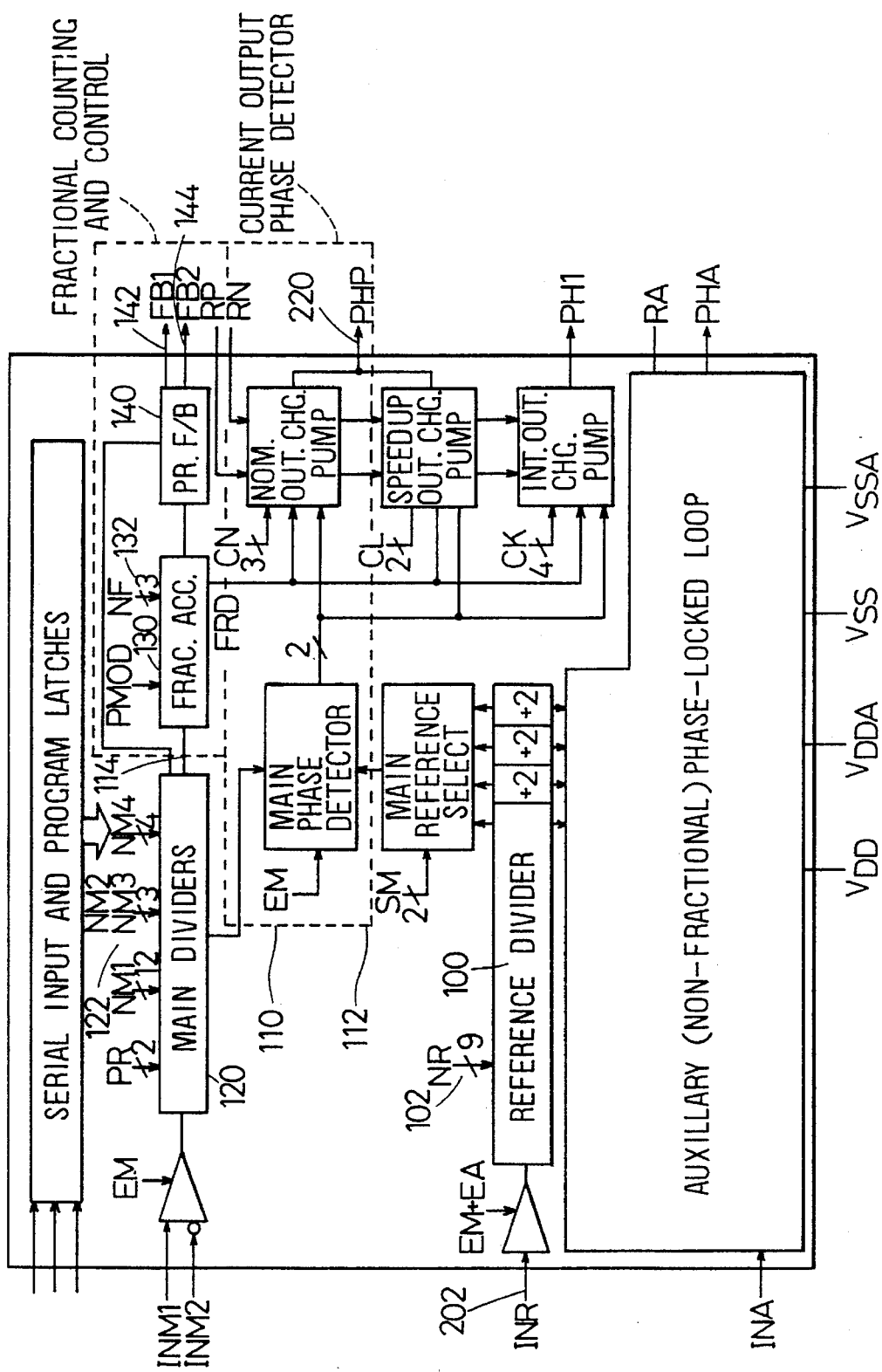
FIG. 1 shows a block diagram of the specific phase locked loop integrated circuit used according to the best mode of the present invention.
Figure 2:
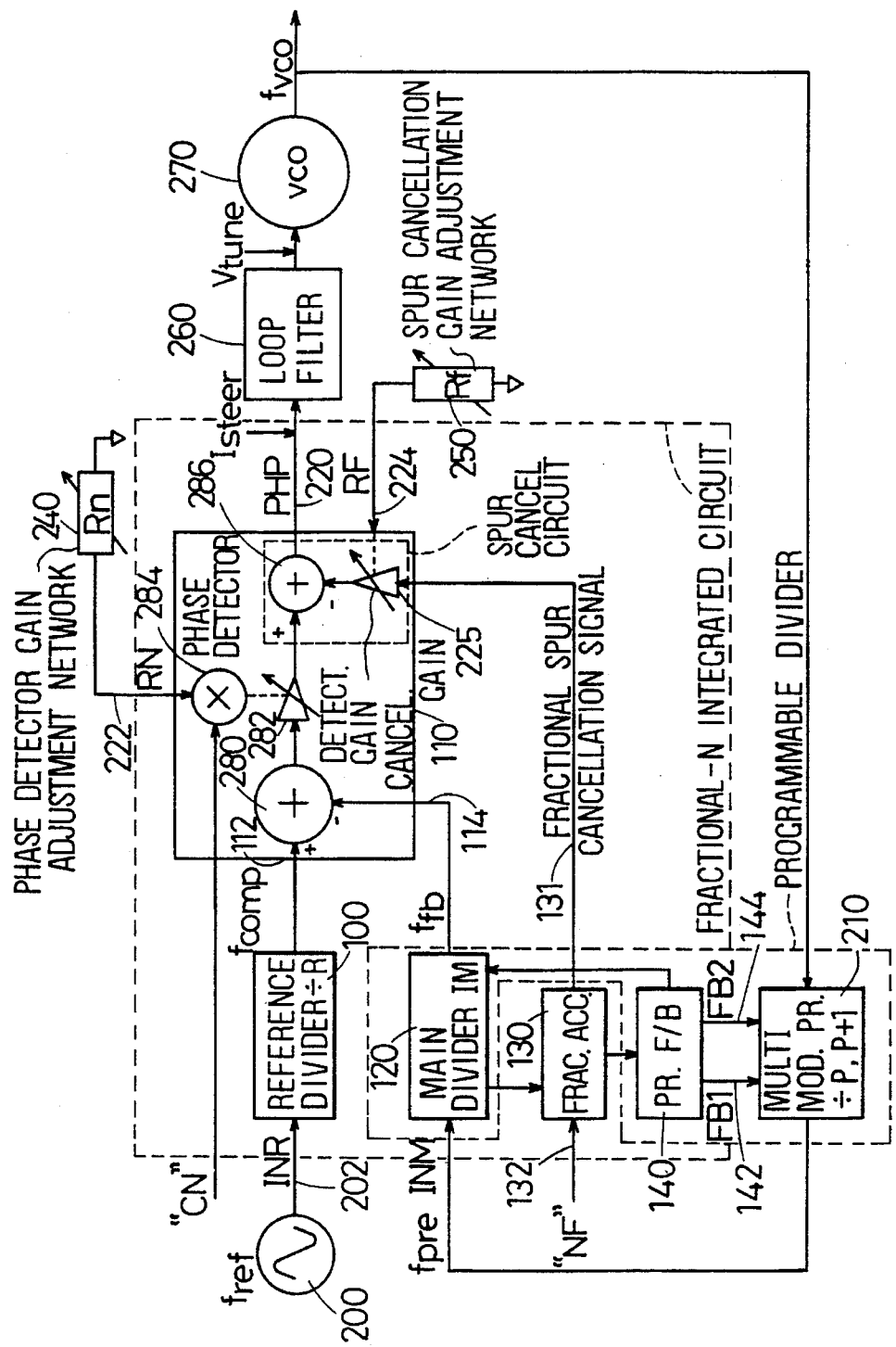
FIG. 2 shows a functional block diagram of the present invention.

FIG. 1 shows a block diagram of a specific fractional-N type phase locked loop ("FNPLL") IC available from Phillips as part no. UMA1005. FIG. 2 shows a functional block diagram of a general FNPLL circuit. The two diagrams will be discussed together, it being understood that FIG. 2 shows the more general block diagram including the entire circuit, while FIG. 1 shows a more specific embodiment of the integrated circuit portion.

The circuit synthesizes output frequencies, $f_{VCO}$, based on a reference frequency generator 200 which is typically embodied as a crystal-controlled clock oscillator. The output of the reference frequency generator 200 is a very stable clock. The clock frequency is input to the loop on input INR 202 and coupled to reference divider 100 which divides the clock rate by R to create a frequency detector compare frequency $f_{comp}$. Reference divider 100 preferably divides the reference frequency by an integer value based on a digital word input which programs the division ratio. The compare frequency output $f_{comp}$ of reference divider 100 is connected to a first input 112 of phase detector 110.

Main divider 120 creates a feedback frequency $f_{fb}$ that is coupled to a second input 114 of phase detector 110. The phase detector compares the phase and frequency of the feedback signal $f_{fb}$ with the reference signal $f_{comp}$. When the loop is in a locked state, $f_{fb}$ and $f_{comp}$ have the same frequency, and the phase difference between them is constant. The division ratio of main divider 120 is also programmable using a digital control word.

One of the most important parts of a fractional-N phase locked loop is its ability to provide fractional counting. The fractional counting is carried out using a fractional accumulator 130, a prescaler feedback network 140, and a multimodulus prescaler 210. A digital word NF, shown as element 132, programs the fractional portion of the overall count. Prescaler feedback, 140 provides one or two outputs, FB1 142 and FB2 144, which are used to control the division ratio of the multi-modulus prescaler for a given $f_{pre}$ cycle.

Figure 4A:
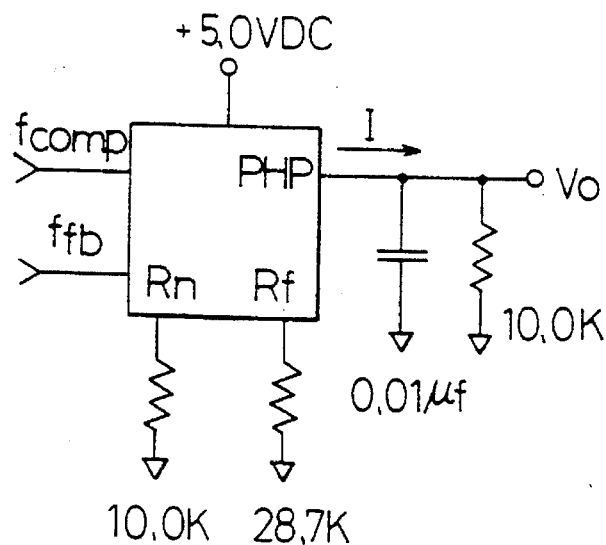
FIG. 4a shows a representative circuit for measuring the phase detector gain, using a fractional-N integrated circuit.
Figure 4B:
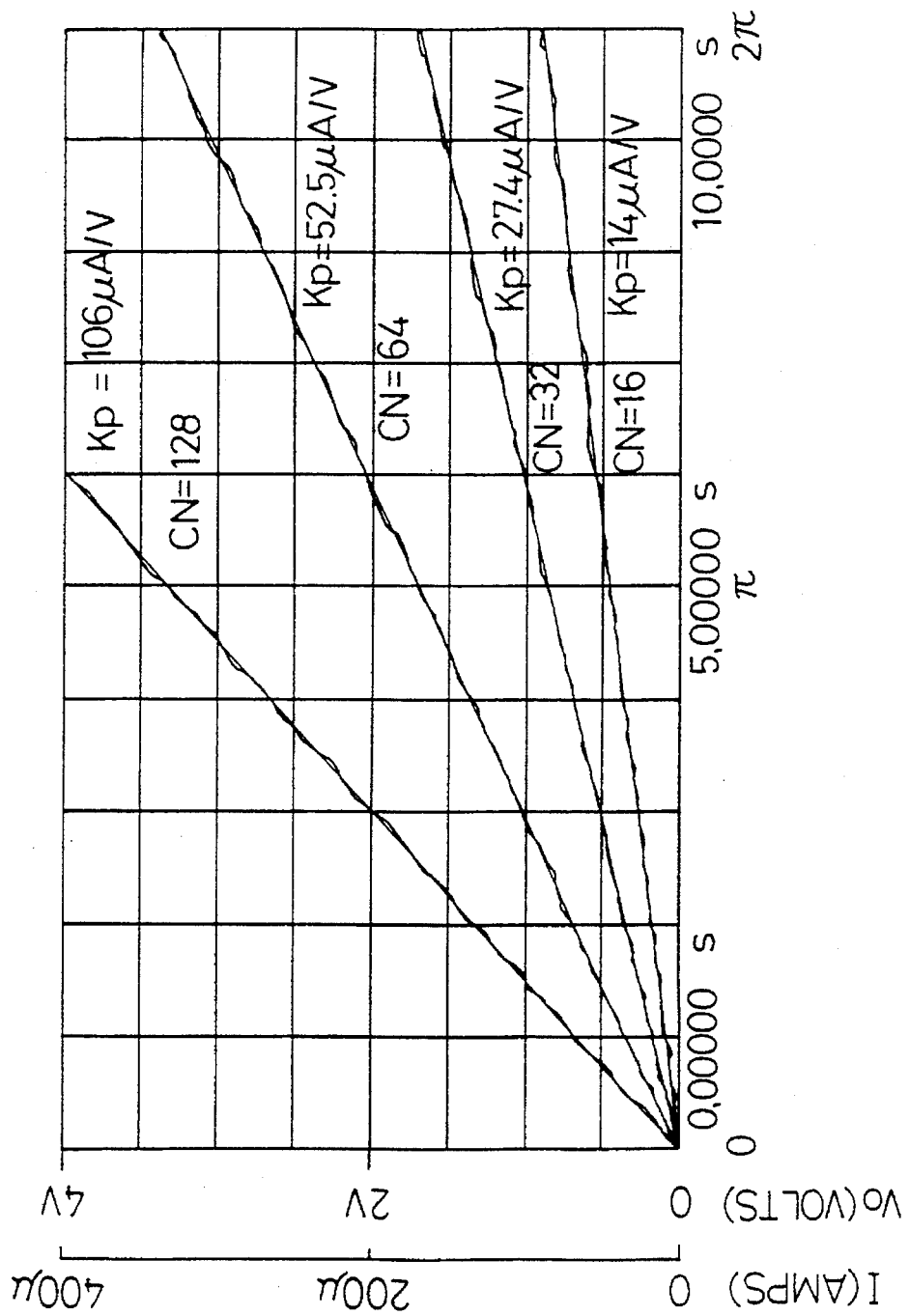
FIG. 4b shows the phase detector gain of this IC for four values of digital programming.

Phase detector 110 compares the phase/frequency of the compare signal 112 with the phase/frequency of the feedback signal 114. The output of the phase detector is an error signal, PHP 220, whose amplitude is indicative of the phase difference between the compare signal 112 and the feedback signal 114. The gain of the phase detector is adjusted by a network 240 attached to port RN 222. Also, for this particular IC device, the phase detector gain can be adjusted independently via digital control word CN. The affect of changing CN is shown in FIG. 4B. However, normal operation uses a CN value that does not change versus temperature. Therefore, throughout this document, a fixed value of CN can be assumed. The phase detector network 240 preferably has the R-T characteristic shown in FIG. 8A. A fractional spur cancellation gain is adjusted by a network 250 attached to spur gain adjustment port RF 224.

The phase detector block 110 shown in FIG. 2 can be modelled as a number of elements which process the signals. The actual phase difference between the compare frequency and the feedback frequency is detected by a phase detector element 280 which effectively subtracts the phase of the two constant amplitude signals resulting in an error signal whose amplitude is a function of a difference in phase. The output of the phase detector element 280 is amplified by a detector amplifier 282. The gain of the detector amplifier is variable and based on the product of the value of the digital control word CN, and a function of the DC resistance of the phase detector network 240. The product of these two inputs is generated by a multiplier 284, thus determining the phase detector gain. The phase detector gain for this particular IC has the units of amperes per radian (of phase difference). Other devices may have units of volts per radian.

The output of detector amplifier 282 is summed with a spur cancellation signal which is obtained from a spur cancellation amplifier 225. Spur cancellation amplifier 225 receives error compensation signal from the fractional accumulator 130, and amplifies it by an amount dependent on the DC resistance of external network 250. The output of spur cancellation amplifier 225 is summed with the output of detector amplifier 282 by adder 286, and the result forms the output $I_{steer}$ of the phase detector 110, at port PHP. Amplitude adder 286, is shown in FIG. 2 as having a "−" input from the cancellation signal. This facilitates the spur cancellation by adding two signals opposite in phase.

The fractional counting, which is carried out according to the preferred embodiment causes an undesirable periodic phase error. Without cancellation, this signal may pass through the loop filter and modulate (in an FM sense) the VCO, 270, causing undesirable spectral lines referred to as fractional spurs.

The fractional spur cancellation gain is determined by network 250 which provides an adjustment to the amount of cancellation desired for a given phase detector gain. As the phase detector gain increases, a proportional increase in cancellation gain is warranted. This network may have similar components to those in network 240.

The final phase detector output 220, $I_{steer}$, steers the voltage controlled oscillator ("VCO") 270 in such a direction as to reduce the error ouput of the phase detector. The steering current can be mathematically expressed as $I_{steer} = \Delta_p * K_p$, where $\Delta_p$ is the phase difference between the compare signal 112 and the feedback signal 114 in radians and $K_p$ is the Phase Detector Gain (in Amps per Radian, for example). When the loop is locked, the average frequency of feedback signal $f_{fb}$, 114, is equal to the frequency of reference compare signal $f_{comp}$. Further, the phase difference between them is a constant.

The phase detector output 220 is coupled to a loop filter 260 which integrates and low pass filters the output of the phase detector 220 to form a VCO steering signal. The pole and zero locations of this filter are critical in determining the loop's frequency (or phase) settling time, noise performance, lock range, and also spur performance. Typically in synthesizer designs, tradeoffs between these performance parameters preclude the loop filter from effectively reducing the fractional spurs to acceptable levels. Therefore, fractional compensation, as described above, is warranted. The preferred layout of the loop filter is simply a passive low-pass filter. Its transfer function $V_{tune}/I_{steer}$ includes one simple zero at $f_z>0$ Hz, one simple pole at $f=0$ Hz, and a complex pole pair at $f_p>f_z$. For digital phase/frequency detectors with integral charge pumps, the phase detector output 220 is usually pulsed current, either sourcing or sinking depending on the polarity of the phase comparator, 280, output.

The loop filter 260 converts this current into a voltage, while low pass filtering and integrating the current pulses.

The voltage controlled oscillator 270 is a VCO of any known type which produces an output frequency $f_{VCO}$ which can be modelled as $f_{VCO}=V_{tune}*K_v$ where $K_v$ is the VCO Gain in Hertz per volt. Appropriate VCOs are available as off-the-shelf hybrid circuits.

Multi-modulus prescaler 210 is a high speed variable frequency divider which operates in conjunction with accumulator 130 and main divider 120 to provide the overall division ratio $N=f_{VCO}/f_{fb}$ of the phase locked loop. Fractional counting is controlled by the fractional accumulator 130. The multi-modulus prescaler 210 is available in integrated circuit form from Motorola, Plessey, Philips, Fujitsu, NEC and others. According to the best mode of the invention, the device used is a Motorola chip number MC12028. This particular device allows division by 32 or 33 and by 64 or 65. Other such devices are available which allow different division ratios. The prescaler may even be integrated in the fractional-N IC.

Multi-modulus prescaler 210 can operate in either a dual modulus mode in which it divides by either one of the two division ratios (e.g. 32 or 33), or in a multi-modulus mode by which it can divide by any of the four division ratios (32 or 33, 64 or 65). Single bit digital control signals, including signal FB1 shown as element 142 and signal FB2 shown as element 144, are used to define which of the division ratios will be used for a given particular $f_{pre}$ cycle. For prescalers used in dual modulus mode, the two division ratios will be referred to herein as division ratio P and division ratio P+1. Only one digital control signal, e.g. FB1, is used in this case. For prescalers which use three modulus or four modulus, both FB1 and FB2 are used to choose one of a multiplicity of division ratios.

The operation of the system will now be described with reference to the accompanying drawings. First, however, some terminology definition is necessary.

The term N refers to the overall division ratio of the phase locked loop, which is equal to the frequency produced by the voltage controlled oscillator, $f_{VCO}$, divided by the average feedback frequency $f_{fb}$, when the loop is in a locked state wherein N may have a fractional component. Note: When the loop is locked, $f_{fb}=f_{comp}$. The phase detector comparison is made once every $f_{comp}$ cycle in a digital phase/frequency detector. In each $f_{fb}$ cycle, there are a number of subdivision cycles. Each subdivision cycle is called an $f_{pre}$ cycle. There are M $f_{pre}$ cycles per $f_{fb}$ cycle. M is the integer division ratio of the main divider, 120. Out of these M $f_{pre}$ cycles, the prescaler is controlled to divide by P during C of those cycles. Where $0 \leq C \leq M$, the prescaler will divide by P+1 for the remaining M−C cycles of $f_{pre}$. C and M are programmed by the user. The fractional accumulator gets incremented once each $f_{fb}$ cycle. The increment value is NF, a digital word programmed by the user. Q can be defined as the maximum number of unique states that the fractional accumulator can assume. The accumulator, therefore, counts MODULO Q with increment NF.

When the fractional accumulator overflows, the prescaler is commanded to change its division ratio from P to P+1 for one $f_{pre}$ cycle within an $f_{fb}$ cycle. This causes the instantaneous division ratio $$\left(\frac{f_{vco}}{f_{fb}}\right)_i$$

for that $f_{fb}$ cycle to increase by one.

Therefore, if an accumulator overflow occurs once every Q cycles of $f_{fb}$, then the average division ratio over Q cycles is $N=N_n+1/Q$ where $N_n$ is the instantaneous division ratio during those $f_{fb}$ cycles without an accumulator overflow. This can be written $N_n=P*C+(P+1)*(M-C)$, where P and P+1 are the division ratios of the dual-modulus prescaler 210, C is the number of $f_{pre}$ cycles in which the P division ratio is controlled, and M is the divider ratio of the Main Divider. Therefore, for the general case when the accumulator overflows NF times in Q cycles, the overall average division ratio is $$N=N_n+NF/Q,$$

where $N_n=P*C+(P+1)*(M-C)$, (C>0), M>=C, and Q>NF>= 0. $N_n$, P, C, M, NF are integers. As mentioned earlier, the use of fractional counting produces an error signal at the phase detector output that FM modulates the VCO and causes undesirable spurs in the output spectrum. A brief description of this process follows. For the case where NF=0 (i.e., no fractional division) the instantaneous division ratio for every $f_{fb}$ cycle is the same. Hence, the average overall division ratio is equal to the instantaneous one found in every $f_{fb}$ cycle. This is not the case when fractional division is employed (i.e., NF>0) however. Here, the instantaneous division ratio for each $f_{fb}$ cycle never equals the overall average division ratio, (taken over Q $f_{fb}$ cycles). Further, during those $f_{fb}$ cycles with no accumulator overflow, a phase error exists (between $f_{fb}$ and $f_{comp}$), that compounds with every successive $f_{fb}$ cycle in which no overflow occurs. Such an error signal is shown in FIG. 3 for a simple case where Q=8 and NF=1.

During each of the first 7 $f_{fb}$ cycles, those with no accumulator overflow, the division ratio is $N_n$ (see above equation). During this time, the phase error compounds as the accumulator state is increased by NF(1) with each $f_{fb}$ cycle. In the eighth $f_{fb}$ cycle, the fractional accumulator overflows and commands the prescaler to change its division ratio from P to P+1 for one $f_{pre}$ cycle. There are M $f_{pre}$ cycles per $f_{fb}$ cycle, as stated above. The additional count causes the compounding phase error to return to zero at the end of the eighth $f_{fb}$ cycle. The whole process then repeats itself.

Figure 3:
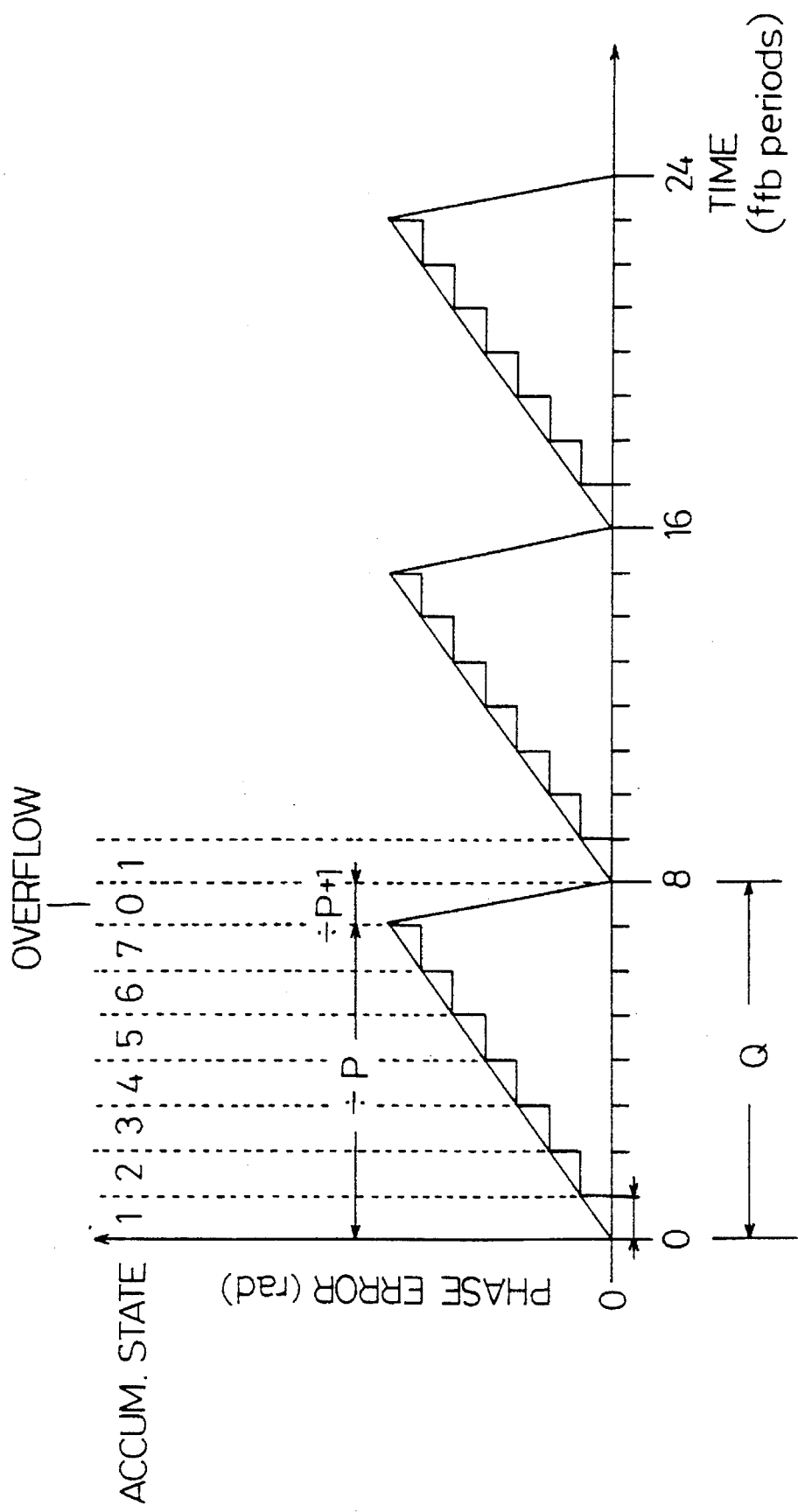
FIG. 3 shows the accumulation of error in the phase detector output due to the fractional counting for one specific example.

Using the example shown in FIG. 3, suppose that the fractional count of N=133.125 is desired. NF must then be programmed to 1; meaning that there will be one overflow in Q (8) cycles. Therefore, if division is by 133 during seven of the cycles, and 134 during the eighth cycle, the overall average division ratio becomes N=133.125.

Loop filter 260 will mathematically integrate and filter the error shown in FIG. 3 and therefore reduce the potential spur. However, the loop filter by itself will not eliminate the whole error. In many synthesizer designs, the "spur" caused by the phase detector error needs to be reduced via a cancellation mechanism.

Returning to the example given above, $N=133.125$, $N_n=133$, $C=10$, $NF=1$, $Q=8$, $P=10$ and $M=13$. In each of the non-overflow $f_{fb}$ cycles, there are C (10) $f_{pre}$ cycles in which the prescaler divides by 10, and M-C (3) $f_{pre}$ cycles in which the prescaler divides by 11 (total 133 $f_{VCO}$ cycles per $f_{fb}$ cycle). When Fractional Accumulator 130 overflows during a $f_{fb}$ cycle, that $f_{fb}$ cycle contains 9 $f_{pre}$ cycles in which the prescaler divides by 10, and 4 $f_{pre}$ cycles in which the prescaler divides by 11 (for a total of 134). Since in this example, the accumulator only overflows in one out of 8 $f_{fb}$ cycles, the average PLL division ratio is: $N=(7*133+1*134)/8=133.125$. When the PLL is phase-locked using this division ratio, the frequency out, $f_{VCO}=f_{comp}*133.125$, $f_{fb}$ (average)=$f_{comp}$, and a constant phase difference exists between $f_{fb}$ (average) and $f_{comp}$. For simplicity, we assume this phase difference is zero radians. Over Q $f_{fb}$ cycles, the average phase error at the Phase Detector output is zero.

However, an instantaneous error exists during each individual $f_{fb}$ cycle, since the count is either 133 or 134. It is never 133.125 exactly—only in the average over Q cycles is the count 133.125, with zero error. If no spur cancellation were present, the error at the Phase Detector output would be that shown in FIG. 3.

During the seven $f_{fb}$ cycles in which the count is 133, the phase of $f_{fb}$ advances on the phase of $f_{comp}$, producing an error ramp as shown. Only when the count goes to 134 does the average error return to zero. This sawtooth error waveform would modulate the VCO 270, producing undesired spectral lines in the VCO output, i.e. fractional spurs. It should be noted that for this example the fundamental period of this sawtooth error waveform is $8_{fb}$ cycles, which FM theory dictates will produce fractional spurs at integer multiples of $+/-(f_{fb}/8)$ Hz offset from the desired carrier ($f_{VCO}$). In general, the most prominent fractional spurs will occur at integer multiples of $+/-\{MIN(NF, Q-NF)*f_{fb}/Q\}$ Hz offset from the carrier, where MIN(x,y) is the minimum of x and y, and $f_{fb}=f_{comp}$ when the loop is phase locked.

Spur cancellation is accomplished by subtracting an equivalent waveform to that of FIG. 3 from the phase detector output to reduce the fractional spur amplitude. Ideal cancellation will be obtained when the amplitude of the fractional modulation and that of the anti-modulation are equal. The term amplitude actually means charge,= amps*time in units of coulombs. However, a sufficient approximation is obtained if the accumulated charges of the two waveforms are equal over a given $f_{fb}$ cycle. Theoretically, the anti-modulation waveform may have any arbitrary envelope provided its total accumulated charge per $f_{fb}$ cycle is equal to the charge of the fractional modulation waveform.

The fractional accumulator state provides the information required to produce the anti-modulation waveform. It can be assumed that the Fractional Accumulator block, 130, in FIG. 2 contains the necessary digital to analog conversion circuitry to produce this waveform at port 131. Phase detector 110 includes cancellation gain amplifier 225 which receives the spur cancellation signal, and inverts and amplifies it by a set amount. The amount of gain is dependent on the spur cancellation network 250 attached to the spur gain adjustment port RF 224.

Network 250 determines the amount of cancellation for a given set of PLL operating conditions by setting the gain at a value where the phase detector error signal and the cancellation signal amplitudes (charges) match, and therefore cancel out.

It was found by the inventor, however, that both the phase detector gain and cancellation gain may vary with change of temperature or other conditions. This temperature variation causes the amplitudes of the signals to become mismatched and the spurious performance of the PLL to degrade. The inventor measured data on Fractional-N ICs and found that the most significant factor related to the degradation in PLL spurious performance is the amount of a change in Phase Detector Gain versus temperature that is not tracked by the Spur Cancellation Gain. Therefore, it may seem appropriate to adjust spur cancellation network 250 ($R_f$) for each significant change in Phase Detector Gain due to temperature. This may be effective at reducing the spur levels, but will have no other effects.

The inventor of the present invention found an alternative way to implement this temperature cancellation in a way which not only reduces spur levels, but also maintains a constant Phase Detector Gain ($K_p$) over temperature, doing both using a single temperature compensation. This is done by replacing $R_n$, not $R_f$, with a temperature-compensated element, preferably a thermistor circuit.

As stated above, the phase detector gain $K_p$ is determined by a combination of the input digital word CN and the value of the network 240 ($R_n$) for a given fixed DC power supply voltage. The gain of the phase detector can be compensated in a way to maintain a constant $K_p$ as a function of temperature for a given CN value, using a thermistor temperature compensation scheme.

Thermistors are temperature sensitive passive components which exhibit a change in electrical resistance when subjected to a change in body temperature. Their sensitivity to minute temperature changes enables them to perform many unique functions. Manufacturers application notes for any standard thermistor network can be used to fit the desired R-T curve. It has been found by the inventor of this invention that a particular variation in $R_n$ will maintain a constant $K_p$ versus temperature for any given value of CN. This is particularly important for phase-locked loop designs in which the phase detector gain is varied versus frequency in order to maintain a constant $K_p/N$ ratio.

The inventor of the present invention found, that the temperature variation in $K_p$ was much greater than the temperature variation in cancellation gain. Therefore, temperature-compensating the gain of the phase detector $K_p$ could be used to temperature-compensate the spur cancellation, allowing a fixed and non temperature-compensated resistor to be used as network 250 (Rf).

An example supporting this theory follows. FIG. 4A shows a fractional-N type counting phase locked loop circuit embodied using a Phillips UMA 1005 integrated circuit. The loop filter and VCO are removed in order to measure $K_p$ directly. FIG. 4B shows phase detector gains of this circuit for different values of CN (a digital programming word). This test was carried out under the conditions of ambient temperature $T_A=+25°$ C., $R_n$ as 10 kohms fixed, Vcc=5 volts DC; $f_{comp}=200.0001$ kHz, $f_{fb}=200.0000$ kHz, Load on the PHP pin being 10 kohms and $R_f=28.7$ kohms. The 0.1 Hz difference between $f_{comp}$ and $f_{fb}$ produces the family of sawtooth waveforms for each programmed value of CN. Only one cycle of each sawtooth is shown. The slope of each curve is equal to the phase detector constant for the particular CN value.

Figure 5:
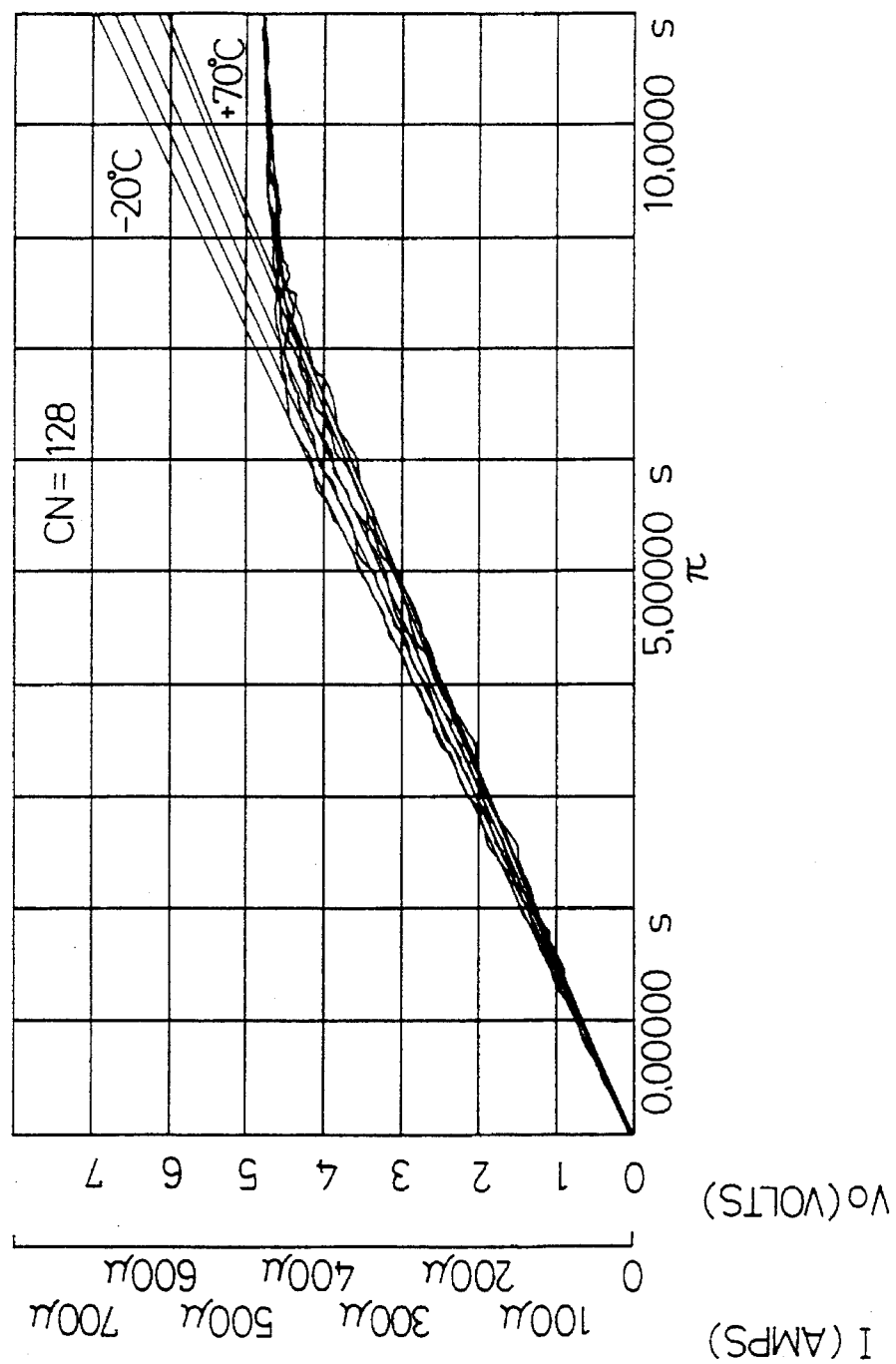
FIG. 5 shows phase detector gain versus temperature.

FIG. 5 shows the variation in phase detector gain $K_p$ with temperature for one particular value of CN (128). FIG. 5 shows multiple curves, plotted at different temperatures between $-20°$ and $+70°$ C. ambient.

In order to illustrate the effect that $K_p$ has on fractional spur cancellation, a phase locked loop was constructed with $f_{VCO}$=728.175 MHz, step size as 25 kHz, and Q=8. Therefore, $f_{comp}$ is 25 kHz*8=200 kHz and N=3640.875, which clearly has a fractional component.

Figure 6:
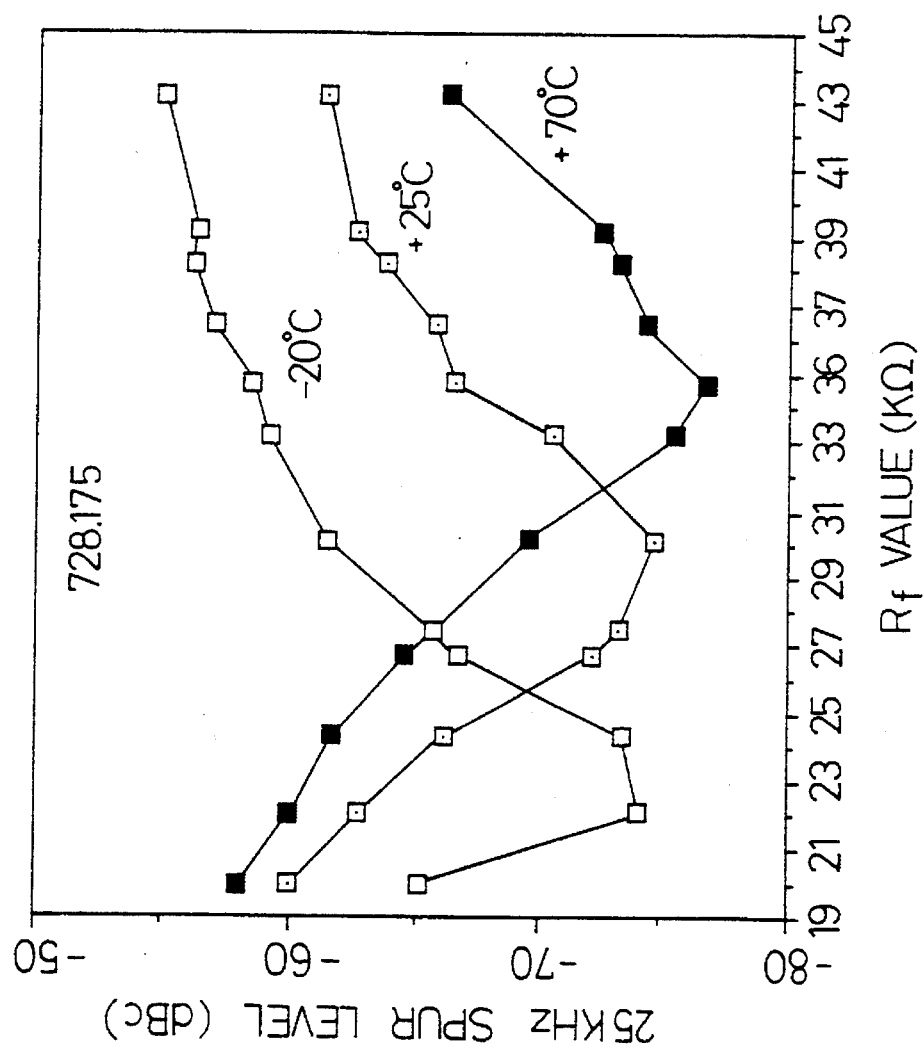
FIG. 6 shows fractional spur levels at a given frequency for three different temperatures.

FIG. 6 shows the dominant measured fractional spur power levels relative to the carrier. Spurs on either side of the carrier are identical in level and only one side is plotted. The dependent variable in this graph is $R_f$ in k-ohms. Data is shown for each of three temperatures: −20°, +25° and +70° C. FIG. 6 shows these values using no temperature compensation.

Of course, the minimum spur level is desired. FIG. 6 shows resultant spurs at the three different temperature values for different values of $R_f$. For −20° C. the optimum $R_f$ value occurs at 22 kohms. At +25° C. it occurs at about 30 kohms and at +70° C. it occurs at about 35 kohms. A fixed value of $R_f$=28 k-ohms provides worst case spur levels no higher than −65 dBc.

Figure 7:
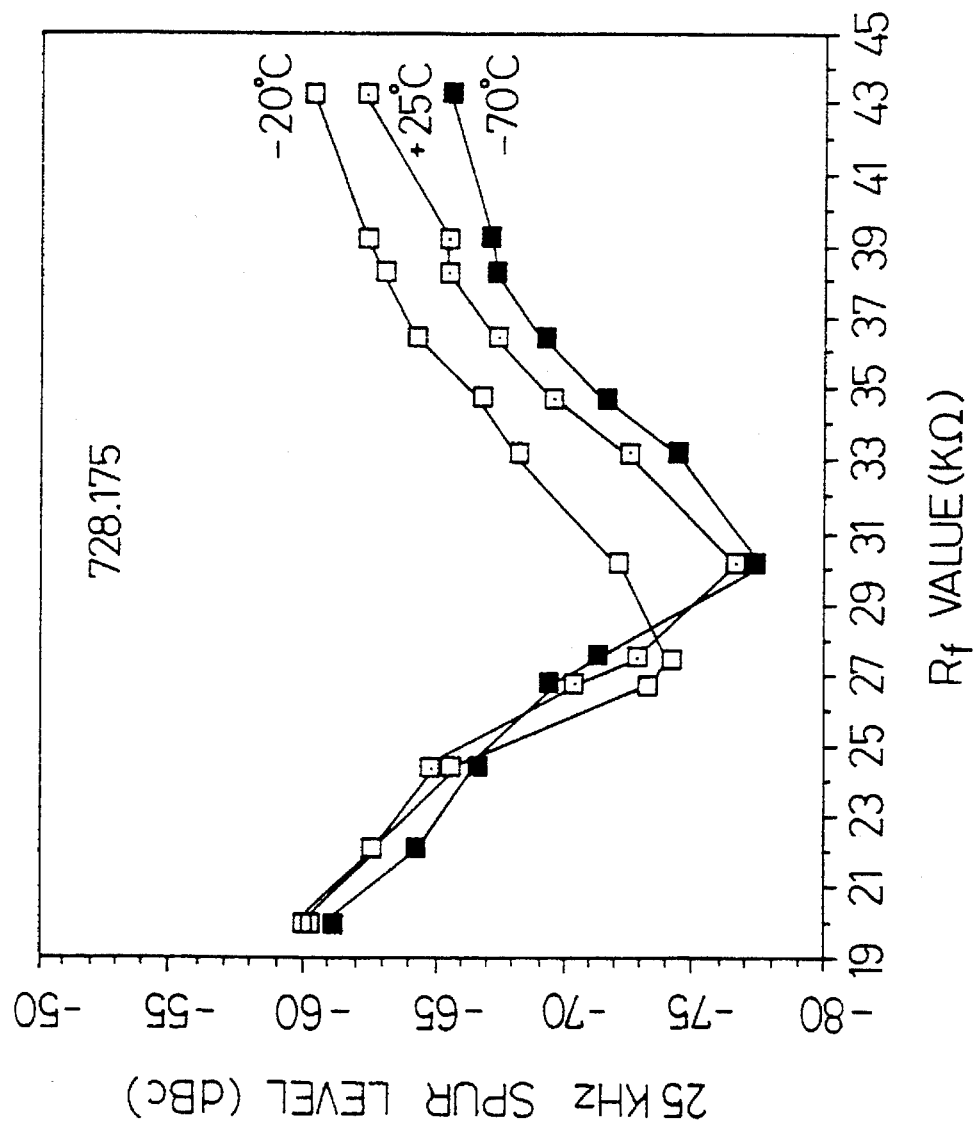
FIG. 7 shows fractional spur levels for these temperatures using phase detector gain compensation.

FIGS. 5 and 6 show a relationship between $K_p$ and the optimum $R_f$ value. As $K_p$ increases, the optimum $R_f$ decreases. The inventor of the present invention postulated based on this data that the drift in $K_p$ was the major cause of the shift in the optimum spur cancellation network ($R_f$). This theory was tested and the results are shown in FIG. 7. The inventor replaced the phase detector gain resistor ($R_n$) in the test PLL with a thermal resistor network which had characteristics such that $K_p$ was held constant over temperature. This resulted in the spur level versus $R_f$ family of curves shown in FIG. 7. These curves are shown to be nearly independent of temperature, validating the inventor's assumptions. Here, a fixed $R_f$=28K provides worst case spur levels no higher than −73 dBc, an 8 dB improvement.

Accordingly, the inventor of the present invention modelled an ideal phase detector gain network ($R_n$) versus temperature and used this to compensate not only phase detector gain $K_p$ but also spur cancellation while using a non-temerature compensated network, using a non-temperature compensated network ($R_f$).

The phase detector gain network $R_n$ is preferably a thermistor that is configured as follows. An ideal $R_n$ versus temperature curve is determined by varying $R_n$ with each temperature in order to maintain a constant phase detector gain. The results are shown in FIG. 8a, which shows ideal, calculated and measured R-T curves for one possible temperature compensation circuit.

Figure 8B:
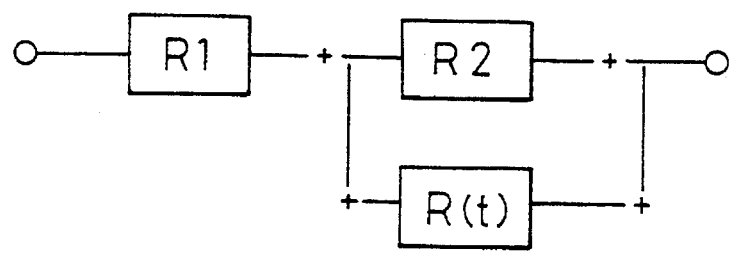
FIGS. 8a and 8b show temperature compensation information, FIG. 8a showing R-T curves for a temperature compensation circuit shown in FIG. 8b.
Figure 8A:
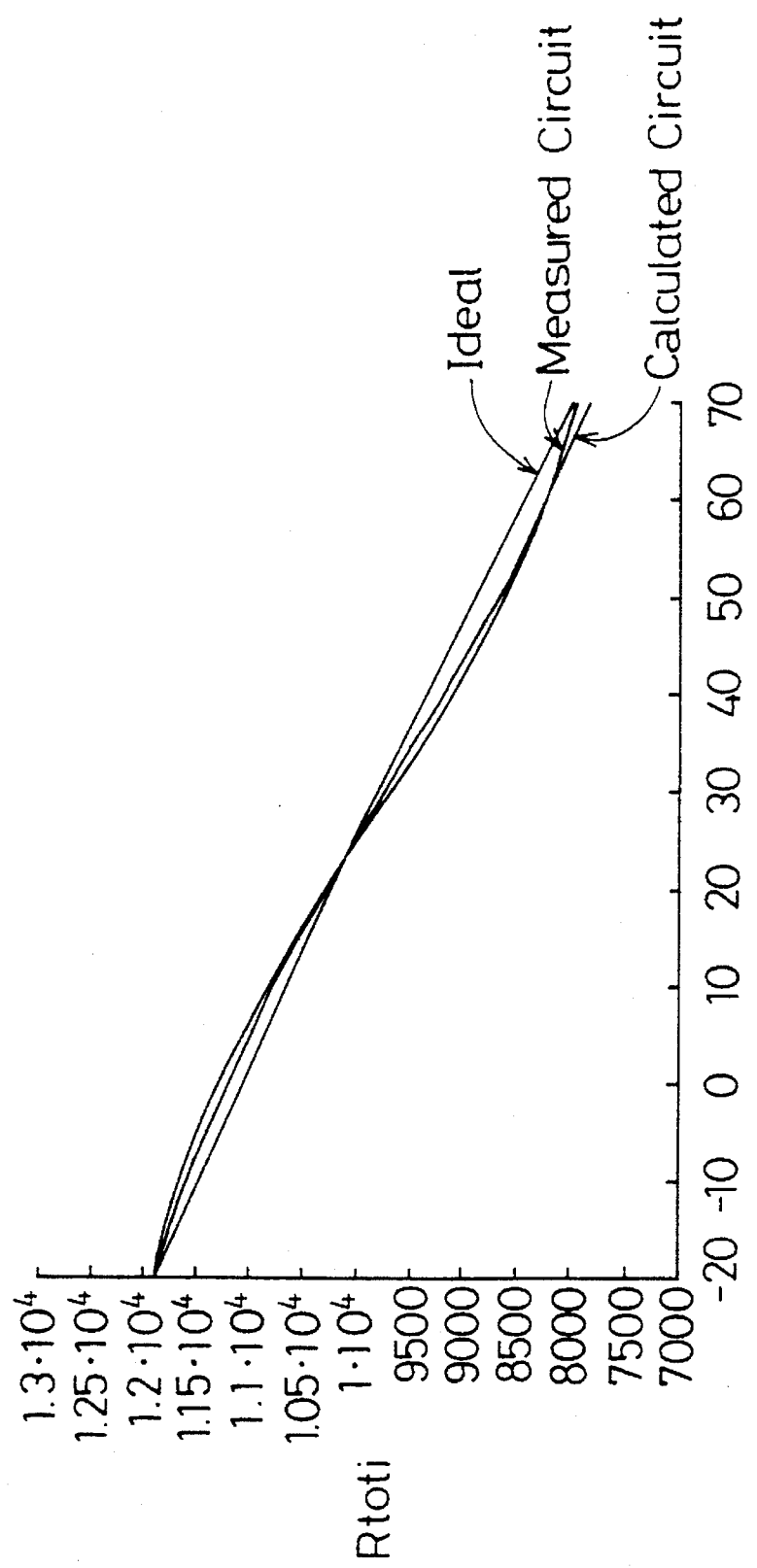

The ideal curve is first used to determine the values of a three-element thermistor circuit shown in FIG. 8b. This particular network, comprised of one thermistor and two fixed resistors, proved to be adequate. Resistor-temperature ("R-T") curves for standard thermistors, available from several different manufacturers, are used to fit the network characteristic resistance to the ideal curve.

Accordingly, using the techniques described above, temperature compensation of spur cancellation can be effected using a thermistor network to compensate phase detector gain. This result was first found by the inventor of the present invention.

Although only a few embodiments have been described in detail above, those having ordinary skill in the art will certainly understand that many modifications are possible in the preferred embodiment without departing from the teachings thereof. For example, the teachings given herein may be applicable to other kinds of phase locked loops beyond the Fractional-N counting type. Even if applied to a Fractional-N counting type loop, these teachings are not limited to integrated-circuit type loops, and of course, also cover those formed of discrete electronics, or an LSI device.

All such modifications are intended to be encompassed within the following claims.

What is claimed is:

1. A temperature compensated fractional-N phase locked loop, which synthesizes a desired output frequency from a given reference frequency, by using fractional division ratios, comprising:

a phase detector, which compares a phase of the reference frequency with a phase of a feedback frequency, and outputs an oscillator steering signal indicative of a difference therebetween;

a voltage controlled oscillator, which produces said desired output frequency based at least partly on said oscillator steering signal;

a programmable divider, receiving said frequency from said voltage controlled oscillator, and dividing said frequency by a dividing ratio, determined from at least two dividing ratios based on a dividing control signal and whose average dividing value has a fractional portion, to produce at its output said feedback frequency;

an accumulator, which controls said fractional portion of said programmable divider's average dividing ratio via said dividing control signal and whose state indicates an error caused by a difference between a current dividing ratio and a desired average dividing ratio, with said error modulating said oscillator steering signal, causing an unwanted spur in an output frequency spectrum of said voltage control oscillator, said phase detector including:
a phase detector gain adjustment port,
a phase detector gain adjustment network attached to said gain adjustment port that at least partially determines a gain of said phase detector,
a spur cancellation gain adjustment port,
a spur cancellation gain network attached to said spur cancellation port,
a spur cancellation circuit to which said spur cancellation gain adjustment port is coupled and receiving from said accumulator a signal indicative of said error and using said signal indicative of error to reduce said spur caused by said error by 1) amplifying said signal indicative of error using a spur cancellation gain element by an amount dependent on values of components of said spur cancellation gain network, and by 2) combining said amplified signal indicative of error with said error modulated oscillator steering signal,
wherein said spur cancellation gain network includes only non-temperature compensated components therein and said phase detector gain adjustment network includes a temperature compensation component therein to temperature compensate simultaneously a gain of said phase detector gain and said spur cancellation, and where an uncompensated temperature variation in said phase detector gain controlled by said gain adjustment network, has a greater effect on spur level than an uncompensated temperature variation of said spur cancellation gain controlled by said spur cancellation gain network.

2. A loop as in claim 1 further comprising a reference frequency generator for generating said reference frequency.

3. A loop as in claim 1 further comprising an integrating loop filter, coupled between said phase detector and said voltage controlled oscillator.

4. A loop as in claim 1 wherein said phase detector includes:

a phase difference detector element which detects a phase difference; and a first amplifier, which amplifies an output of said phase difference detector element by an amount at least partially dependent on values of components in said phase detector gain adjustment network, and wherein said spur cancellation circuit includes a spur cancellation amplifier, which receives said signal indicative of said error, and amplifies and inverts a sense of said signal indicative of said error by an amount determined by said spur cancellation gain network attached thereto, and an adder, adding an output of said first amplifier with an output of said spur cancellation amplifier to produce said oscillator steering signal.

5. A loop as in claim 1 wherein said spur cancellation gain network includes only fixed resistors.

6. A loop as in claim 5 wherein said phase detector gain adjustment network includes both fixed resistors and at least one thermistor.

7. A temperature-compensated phase locked loop incorporating a fractional-N type integrated circuit, said loop comprising:

a phase detector receiving a reference frequency at one detection input and a feedback frequency at another detection input and producing an oscillator steering signal indicative of a phase difference therebetween;

a voltage controlled oscillator responsive at least partially to said oscillator steering signal to produce a desired output frequency;

a plurality of components including a temperature compensating component controlling one functional part of said phase locked loop, and which is effective in compensating another functional part of said phase locked loop, wherein an uncompensated temperature variation in said one functional part has a greater effect on an error caused by a difference between a current dividing ratio used to modify said feedback frequency and a desired average dividing ratio than an uncompensated temperature variation of said another functional part;

a programmable divider, receiving said frequency from said voltage controlled oscillator, and dividing said frequency by one of at least two dividing ratios which are chosen based on a dividing control signal and whose average dividing ratio has a fractional portion, to produce at its output said feedback frequency;

an accumulator, which controls said fractional portion of said programmable divider's average dividing ratio via said dividing control signal and whose state indicates an error caused by a difference between a current dividing ratio and a desired average dividing ratio, with said error modulating said oscillator steering signal causing an unwanted spur in an output frequency spectrum of said voltage controlled oscillator; wherein said phase detector includes a phase detector gain adjustment port and a phase detector gain adjustment network attached thereto that determines at least partially a gain of said phase detector, and a spur cancellation circuit with a spur cancellation gain network attached thereto via a spur cancellation adjustment port, said spur cancellation circuit receiving from said accumulator a signal indicative of said error and using said signal indicative of said error to reduce said spur caused by said error by 1) amplifying said signal indicative of said error by an amount dependent on values of components in said spur cancellation gain network, and 2) by combining said amplified signal indicative of error with said error modulated oscillator steering signal;

said phase detector gain adjustment network includes said temperature compensating component therein to temperature compensate a gain of said phase detector; and said spur cancellation gain network includes only non-temperature compensated components therein, whereby said spur cancellation is temperature compensated by said phase detector gain adjustment network.

8. A temperature-compensated fractional-N type phase locked loop in which a division operation is performed to divide by one of at least two division ratios resulting in an average division ratio having a fractional portion and in which fractional spur modulation is generated from said division operation, said loop comprising:

a phase detector, receiving a reference frequency at one detection input, and a feedback frequency at another detection input, and producing an oscillator steering signal indicative of a phase difference therebetween;

a voltage controlled oscillator, responsive at least partially to said oscillator steering signal to produce a desired output frequency;

a plurality of components, including a temperature compensating component controlling one functional part of said phase locked loop, and which is effective in compensating another functional part of said phase locked loop, wherein an uncompensated temperature variation in said one functional part has a greater effect on an error caused by a difference between a current dividing ratio used to modify said feedback frequency and a desired average dividing ratio than an uncompensated temperature variation of said another functional part;

a spur cancellation circuit containing a spur cancellation gain element controlled by a spur cancellation gain network; and a phase detector gain element controlled by a phase detector gain adjustment network; wherein said temperature compensating component is provided in said phase detector gain adjustment network and temperature compensates a gain of said phase detector; and said spur cancellation gain network includes only non-temperature compensated components.

9. A temperature compensated fractional-N phase locked loop, which divides by a desired fractional dividing ratio, comprising:

a phase detector, which compares a phase of a reference frequency with a phase of a feedback frequency, and outputs an error signal indicative of a difference therebetween, said error signal causing undesired phase modulation, said phase detector including a variable gain element controlled by a gain adjustment network attached thereto which amplifies said error signal by an amount at least partially dependent on component values of said gain adjustment network;

a voltage controlled oscillator, which produces a frequency which is based at least partly on said error signal;

a phase modulation cancellation element, with a phase modulation cancellation network attached thereto, receiving a signal indicative of phase error, and using said signal indicative of phase error to compensate for said undesired modulation, by 1) amplifying said signal indicative of phase error by an amount dependent on values of components in said phase modulation cancellation network, and by 2) combining said signal indicative of phase error with said error signal, wherein said gain adjustment network includes a temperature compensation component therein to temperature-compensate a gain of said phase detector, and wherein said phase modulation cancellation network includes only non-temperature compensated components therein, wherein a uncompensated temperature variation in said phase detector has a greater effect on said phase error than an uncompensated temperature variation of a gain of said phase modulation cancellation element whereby said phase modulation cancellation is temperature compensated by said gain adjustment network.

10. A phase locked loop as in claim 9, wherein said phase modulation produces a spur.

11. A method of temperature-compensating a phase locked loop, comprising the steps of:

comparing a phase of a reference frequency with a phase of a feedback frequency to output a difference signal indicative thereof;

multiplying said difference signal by a gain dependent on a first network to produce an amplified difference signal;

temperature compensating said first network;

producing an output frequency based on said amplified difference signal;

cancelling a phase modulation indicative of phase error, using a cancellation circuit controlled by component values of a second network attached thereto, said second network including only non-temperature compensated components, and temperature compensating said phase modulation cancellation using said temperature compensation of said first network, wherein a temperature variation in a gain of said first network has a greater effect on phase modulation indicative of phase error than a temperature variation of a gain of said second network.

12. A method as in claim 11, wherein said cancelling a phase modulation step is a step of cancelling a spur caused by accumulated error of fractional counting.

* * * * *

UNITED STATES PATENT AND TRADEMARK OFFICE
CERTIFICATE OF CORRECTION

PATENT NO. : 5,576,666
DATED : November 19, 1996
INVENTOR(S) : Roger Rauvola

It is certified that error appears in the above-identified patent and that said Letters Patent is hereby corrected as shown below:

On the title page, item [73] reads:

Assignee: "Nippondenso Technical Center USA, Inc., Carlstad, Calif."

should read--

[73] Assignee: --Nippondenso Co., Ltd., Kariya-city, Japan--

Signed and Sealed this

Twenty-eighth Day of December, 1999

Attest:

Q. TODD DICKINSON

*Attesting Officer*   *Acting Commissioner of Patents and Trademarks*